(12) United States Patent
Negley et al.

(10) Patent No.: US 7,029,935 B2
(45) Date of Patent: Apr. 18, 2006

(54) TRANSMISSIVE OPTICAL ELEMENTS INCLUDING TRANSPARENT PLASTIC SHELL HAVING A PHOSPHOR DISPERSED THEREIN, AND METHODS OF FABRICATING SAME

(75) Inventors: Gerald H. Negley, Hillsborough, NC (US); Ban Loh, Durham, NC (US)

(73) Assignee: Cree, Inc., Durham, NC (US)

( * ) Notice: Subject to any disclaimer, the term of this patent is extended or adjusted under 35 U.S.C. 154(b) by 117 days.

(21) Appl. No.: 10/659,240

(22) Filed: Sep. 9, 2003

(65) Prior Publication Data
US 2005/0051782 A1    Mar. 10, 2005

(51) Int. Cl.
*H01L 21/00*    (2006.01)

(52) U.S. Cl. .............................. 438/29; 257/80; 257/98; 438/25

(58) Field of Classification Search ................. 257/80, 257/89, 98; 313/501, 503; 438/26, 29, 116; 200/314; 349/69; 379/433.07
See application file for complete search history.

(56) References Cited

U.S. PATENT DOCUMENTS

| | | | |
|---|---|---|---|
| 4,042,552 A | 8/1977 | Grucza | |
| 4,107,238 A | 8/1978 | Roper et al. | |
| 4,141,941 A | 2/1979 | Travnicek | |
| 4,320,268 A * | 3/1982 | Brown ........................ | 200/5 A |
| 4,562,018 A | 12/1985 | Neefe | |
| 4,826,424 A | 5/1989 | Arai et al. | |
| 4,918,497 A | 4/1990 | Edmond | |
| 4,966,862 A | 10/1990 | Edmond | |
| 5,027,168 A | 6/1991 | Edmond | |
| 5,087,949 A | 2/1992 | Haitz | |
| 5,110,278 A | 5/1992 | Tait et al. | |
| 5,143,660 A | 9/1992 | Hamilton et al. | |
| 5,210,051 A | 5/1993 | Carter, Jr. | |
| 5,277,840 A | 1/1994 | Osaka et al. | |
| 5,338,944 A | 8/1994 | Edmond et al. | |
| 5,374,668 A | 12/1994 | Kanemura et al. | |
| 5,393,993 A | 2/1995 | Edmond et al. | |
| 5,416,342 A | 5/1995 | Edmond et al. | |
| 5,477,430 A * | 12/1995 | LaRose ........................ | 362/84 |
| 5,523,589 A | 6/1996 | Edmond et al. | |

(Continued)

FOREIGN PATENT DOCUMENTS

JP    5-152609 A    6/1993

(Continued)

OTHER PUBLICATIONS

Craford, *Overview of Device Issues in High-Brightness Light-Emitting Diodes*, Chapter, *High Brightness Light Emitting Diodes: Semiconductors and Semimetals*, vol. 48, Stringfellow et al. ed., Academic Press, 1997, pp. 47-63.

(Continued)

Primary Examiner—David Nelms
Assistant Examiner—Dao H. Nguyen
(74) Attorney, Agent, or Firm—Myers Bigel Sibley & Sajovec

(57) ABSTRACT

A transmissive optical element is fabricated by filling a mold with molten liquid that includes a transparent plastic and a phosphor additive, and allowing the molten liquid to solidify to produce the transmissive optical element having phosphor dispersed therein. Accordingly, a separate phosphor coating or phosphor-containing encapsulant need not be used. Transmissive optical elements include a shell made of transparent plastic with a phosphor dispersed therein. The phosphor may be uniformly and/or nonuniformly dispersed in the shell.

9 Claims, 3 Drawing Sheets

U.S. PATENT DOCUMENTS

| | | | |
|---|---|---|---|
| 5,604,135 | A | 2/1997 | Edmond et al. |
| 5,631,190 | A | 5/1997 | Negley |
| 5,669,486 | A * | 9/1997 | Shima .................. 200/314 |
| 5,739,554 | A | 4/1998 | Edmond et al. |
| 5,753,730 | A | 5/1998 | Nagata et al. |
| 5,813,753 | A | 9/1998 | Vriens et al. |
| 5,851,063 | A | 12/1998 | Doughty et al. |
| 5,858,278 | A | 1/1999 | Itoh et al. |
| 5,882,553 | A | 3/1999 | Prophet et al. |
| 5,912,477 | A | 6/1999 | Negley |
| 5,959,316 | A | 9/1999 | Lowery |
| 5,968,422 | A | 10/1999 | Kennedy |
| 6,066,861 | A | 5/2000 | Höhn et al. |
| 6,069,440 | A | 5/2000 | Shimizu et al. |
| 6,120,600 | A | 9/2000 | Edmond et al. |
| 6,156,242 | A | 12/2000 | Saito et al. |
| 6,177,688 | B1 | 1/2001 | Linthicum et al. |
| 6,187,606 | B1 | 2/2001 | Edmond et al. |
| 6,201,262 | B1 | 3/2001 | Edmond et al. |
| 6,252,254 | B1 | 6/2001 | Soules et al. |
| 6,329,676 | B1 | 12/2001 | Takayama et al. |
| 6,346,973 | B1 * | 2/2002 | Shibamoto et al. .......... 349/69 |
| 6,373,188 | B1 | 4/2002 | Johnson et al. |
| 6,383,417 | B1 | 5/2002 | Paulson et al. |
| 6,391,231 | B1 | 5/2002 | Evans et al. |
| 6,404,125 | B1 | 6/2002 | Garbuzov et al. |
| 6,521,915 | B1 * | 2/2003 | Odaki et al. ................. 257/98 |
| 6,576,930 | B1 * | 6/2003 | Reeh et al. ................... 257/98 |
| 6,734,465 | B1 * | 5/2004 | Taskar et al. ................ 257/80 |
| 6,744,077 | B1 | 6/2004 | Trottier et al. |
| 6,853,131 | B1 * | 2/2005 | Srivastava et al. ......... 313/503 |
| 2002/0123164 | A1 | 9/2002 | Slater, Jr. et al. |
| 2002/0172354 | A1 * | 11/2002 | Nishi .................... 379/433.07 |
| 2003/0006418 | A1 | 1/2003 | Emerson |
| 2003/0067758 | A1 * | 4/2003 | Shipman .................... 362/26 |
| 2003/0153861 | A1 | 8/2003 | Royer |
| 2003/0173575 | A1 | 9/2003 | Eisert et al. |

FOREIGN PATENT DOCUMENTS

| | | | |
|---|---|---|---|
| JP | 6-151974 | A | 5/1994 |
| JP | 6-177429 | A | 6/1994 |
| JP | 6-244458 | A | 9/1994 |
| JP | 8-162676 | A | 6/1996 |
| JP | 9-246603 | A | 9/1997 |
| JP | 10-242513 | A | 9/1998 |
| JP | 11-261114 | A | 9/1999 |
| JP | 11-298047 | A | 10/1999 |
| JP | 2000-101147 | A | 4/2000 |
| JP | 2000-174347 | A | 6/2000 |
| JP | 2000-183405 | A | 6/2000 |
| JP | 2000-286455 | A | 10/2000 |
| JP | 2000-286458 | A | 10/2000 |
| JP | 2001-77427 | A | 3/2001 |
| JP | 2001-77433 | A | 3/2001 |
| JP | 2001-144334 | A | 5/2001 |
| JP | 2001-230453 | A | 8/2001 |
| JP | 2002-118293 | A | 4/2002 |
| JP | 2002-158378 | A | 5/2002 |
| JP | 2002-223004 | A | 8/2002 |
| JP | 2002-280616 | A | 9/2002 |
| JP | 2003-17755 | A | 1/2003 |
| WO | WO 01/61764 | A1 | 8/2001 |
| WO | WO 02/059982 | A1 | 8/2002 |

OTHER PUBLICATIONS

Loh, *Power Surface Mount Light Emitting Die Package,* U.S. Appl. No. 10/446,532, May 27, 2003.

Slater, Jr. et al., *Phosphor-Coated Light-Emitting Diodes Including Tapered Sidewalls and Fabrication Methods Therefor,* U.S. Appl. No. 60/411,980, Sep. 19, 2002.

Notification of Transmittal of the International Search Report and The Written Opinion of the International Searching Authority, or the Decleration, International Search Report and Written Opinion of the International Searching Authority, PCT/US2004/017325, Sep. 28, 2004.

International Search Report, PCT/US03/27912, Jan. 30, 2004.

* cited by examiner

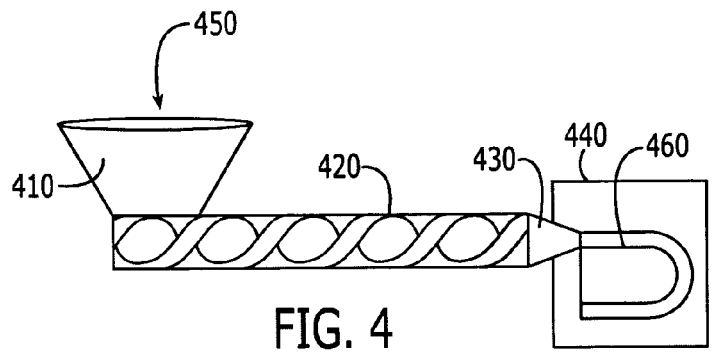
FIG. 4
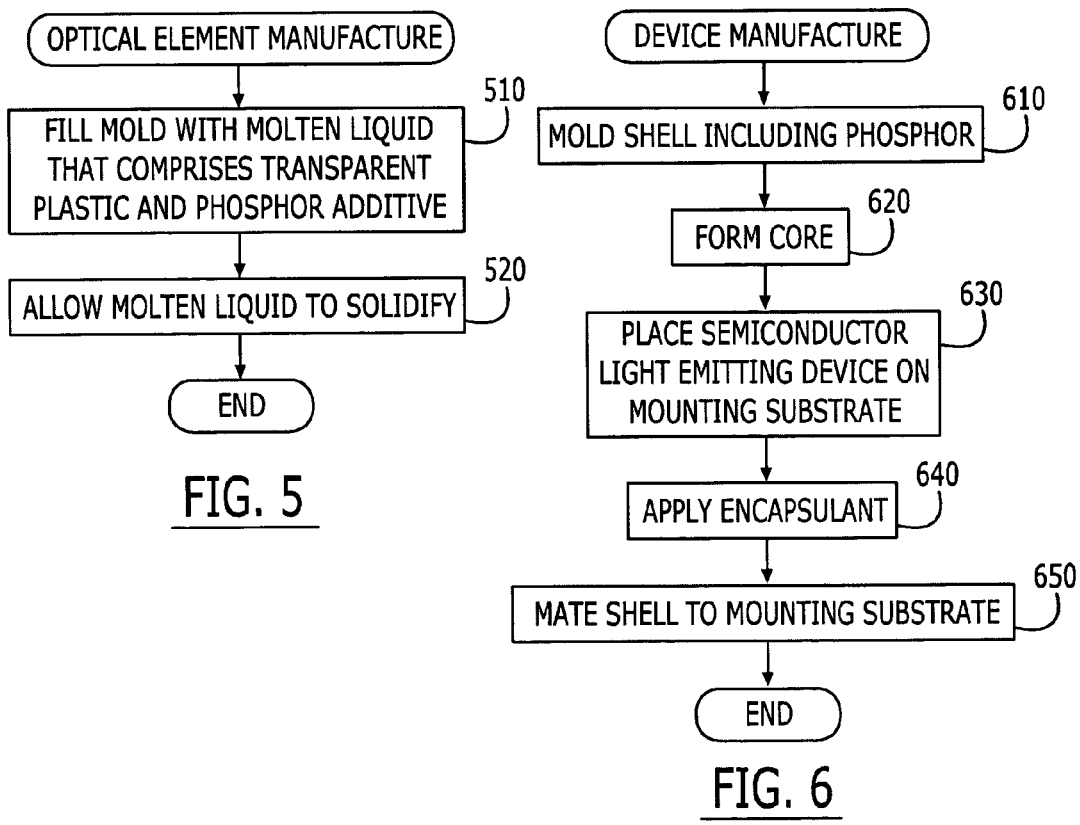
FIG. 5
FIG. 6

TRANSMISSIVE OPTICAL ELEMENTS INCLUDING TRANSPARENT PLASTIC SHELL HAVING A PHOSPHOR DISPERSED THEREIN, AND METHODS OF FABRICATING SAME

FIELD OF THE INVENTION

This invention relates to light emitting devices and fabricating methods therefor, and more particularly to packaging and packaging methods for light emitting devices.

BACKGROUND OF THE INVENTION

Semiconductor light emitting devices such as Light Emitting Diodes (LED) or laser diodes are widely used for many applications. As is well known to those having skill in the art, a semiconductor light emitting diode is generally packaged by at least partially surrounding the semiconductor light emitting diode with a dome-shaped transparent plastic shell.

It is often desirable to incorporate a phosphor into the light emitting device, to enhance the emitted radiation in a particular frequency band and/or to convert at least some of the radiation to another frequency band. Phosphors may be included in a light emitting device using many conventional techniques. In one technique, phosphor is coated inside and/or outside the plastic shell. In other techniques, phosphor is coated on the semiconductor light emitting device itself, for example using electrophoretic deposition. In still other embodiments, a drop of a material such as epoxy that contains phosphor therein may be placed inside the plastic shell, on the semiconductor light emitting device and/or between the device and the shell. LEDs that employ phosphor coatings are described, for example, in U.S. Pat. Nos., 6,252,254; 6,069,440; 5,858,278; 5,813,753; 5,277,840; and 5,959,316.

Packaging may constitute a major portion of the expense and/or fabrication time for a finished light emitting device.

SUMMARY OF THE INVENTION

Some embodiments of the present invention form a transmissive optical element by filling a mold with molten liquid that comprises a transparent plastic and a phosphor additive, and allowing the molten liquid to solidify to produce the transmissive optical element having phosphor dispersed therein. Accordingly, these embodiments need not provide a separate phosphor coating or phosphor-containing encapsulant, although they may.

In some embodiments of the present invention, the transmissive optical element is a dome through which a light emitting device emits light. In these embodiments, a transparent core may also be formed inside the dome. Alternatively, the transparent core may first be formed and then the molding may be performed by filling a domed-shaped mold that includes the transparent core with a molten liquid that comprises a transparent plastic and a phosphor additive.

In still other embodiments, the transmissive optical element is a keypad key through which a light emitting device emits light. In yet other embodiments, the optical element is a keypad key face through which a light emitting device emits light. In these embodiments, a separate step may be provided for forming a keypad key wall that is attached to the keypad key face.

Transmissive optical elements according to some embodiments of the present invention include a shell that comprises a transparent plastic including a phosphor dispersed therein. In some embodiments, the phosphor is uniformly dispersed in the shell, whereas in other embodiments, the phosphor is nonuniformly dispersed in the shell.

In some embodiments, the shell is a dome-shaped shell and the transmissive optical element further comprises a transparent inner core inside the dome-shaped shell. In some embodiments, the transparent inner core fills the dome-shaped shell to provide a hemispherical optical element. In yet other embodiments, the dome-shaped shell may be combined with a semiconductor light emitting device that is configured to emit light into and through the transparent inner core and through the dome-shaped shell, to emerge from the dome-shaped shell. Still other embodiments add a mounting substrate that is adjacent the semiconductor light emitting device and remote from the transparent inner core. Still other embodiments add an encapsulant between the light emitting device and the transparent core.

In other embodiments of the invention, the shell is a keypad key shell including a keypad key face and a keypad key wall that extends from the keypad key face. In some of these embodiments, phosphor is uniformly dispersed in the keypad key shell. In other embodiments, phosphor is uniformly dispersed in the keypad key face, and is not included in the keypad key wall. In still other embodiments, phosphor is nonuniformly dispersed in the keypad key face and may or may not be included in the keypad key wall.

Light emitting devices according to other embodiments of the present invention include a mounting substrate and a semiconductor light emitting device on the mounting substrate. A dome-shaped shell that comprises a transparent plastic including a phosphor dispersed therein is provided on the mounting substrate and at least partially surrounds the semiconductor light emitting device. A transparent inner core is provided inside the dome-shaped shell. In other embodiments, an encapsulant is provided between the semiconductor light emitting device and the transparent inner core. In still other embodiments, the mounting substrate includes therein a cavity, the semiconductor light emitting device is at least partially in the cavity, the dome-shaped shell is on the mounting substrate surrounding the cavity and the encapsulant is in the cavity.

BRIEF DESCRIPTION OF THE DRAWINGS

FIG. 4 is a schematic diagram of a molding apparatus that may be used to fabricate optical elements according to embodiments of the present invention.

FIGS. 5 and 6 are flowcharts of operations that may be performed to fabricate light emitting devices according to embodiments of the present invention.

DETAILED DESCRIPTION

Figure 1A:
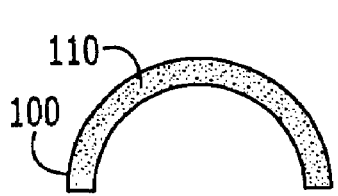
FIGS. 1A–1H are cross-sectional views of transmissive optical elements according to first embodiments of the present invention that may provide semiconductor light emitting devices.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. It will be understood that if part of an element, such as a surface of a conductive line, is referred to as "outer," it is closer to the outside of the device than other parts of the element. Furthermore, relative terms such as "beneath" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements.

FIGS. 1A–1H are cross-sectional views of transmissive optical elements according to various embodiments of the present invention. These optical elements may be used to package light emitting devices, such as semiconductor light emitting devices.

As shown in FIG. 1A, transmissive optical elements according to some embodiments of the present invention include a shell 100 that comprises transparent plastic. The shell 100 includes a phosphor 110 dispersed therein. As is well known to those having skill in the art, the shell may comprise polycarbonate material and/or other conventional plastic materials that are used to fabricate transmissive optical elements. Moreover, the phosphor can comprise any conventional phosphor including cerium-doped YAG and/or other conventional phosphors. In some specific embodiments, the phosphor comprises Cesium doped Yttrium Aluminum Garnet (YAG:Ce). In other embodiments, nanophosphors may be used. Phosphors are well known to those having skill in the art and need not be described further herein.

Figure 1B:
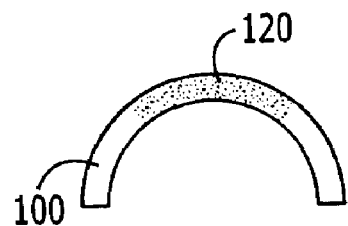

In FIG. 1A, the phosphor 110 is uniformly dispersed within the shell 100. In contrast, in FIG. 1B, the phosphor 120 is nonuniformly dispersed in the shell. Various patterns of phosphor 120 may be formed, for example, to provide areas of higher intensity and/or different color and/or to provide various indicia on the shell 100 when illuminated. In FIGS. 1A–1B, the shell 100 is a dome-shaped shell. As used herein, the terms "dome" and "dome-shaped" refer to structures having a generally arcuate surface profile, including regular hemispherical structures as well as other generally arcuate structures that do not form a regular hemisphere, which are eccentric in shape and/or have other features, structures and/or surfaces. Moreover, as will be described below, various other shapes may be provided.

Figure 1C:
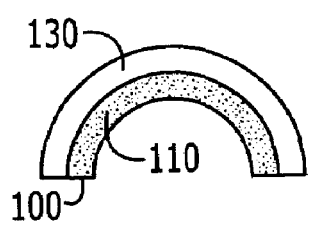
Figure 1D:
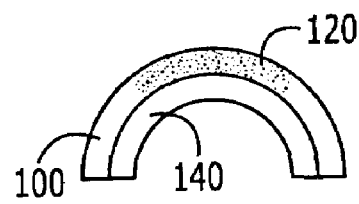

Referring now to FIG. 1C, one or more coatings 130 may be provided on the outside of the shell 100. The coating may be a protective coating, a polarizing coating, a coating with indicia and/or any other conventional coating for an optical element that is well known to those having skill in the art. In FIG. 1D, one ore more inner coatings 140 is provided on the inner surface of the shell 100. Again, any conventional coating or combination of coatings may be used.

Moreover, other embodiments of the invention provide both an inner and an outer coating for the shell 100 that includes uniformly distributed phosphor 110 and/or nonuniformly distributed phosphor 120 therein. By providing an inner and outer coating, improved index matching to the phosphor may be provided. Thus, three layers may be injection molded according to some embodiments of the present invention. Other embodiments of the present invention can use an index matching media, such as a liquid and/or solid gel, within the shell, to assist in index matching. The use of inner and outer layers can reduce the number of photons that can be trapped in the phosphor-containing layer due to index matching issues.

Figure 1E:
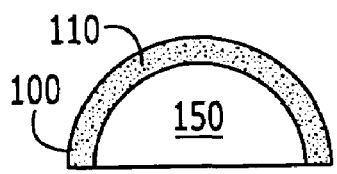

FIG. 1E describes other embodiments of the present invention wherein a transparent inner core 150 is provided inside the dome-shaped shell 100. In some embodiments, as also shown in FIG. 1E, the transparent inner core 150 fills the dome-shaped shell 100, to provide a hemispherical optical element. The transparent inner core 150 may be uniformly transparent and/or may include translucent and/or opaque regions therein. The transparent inner core 150 may comprise glass, plastic and/or other optical coupling media.

Figure 1F:
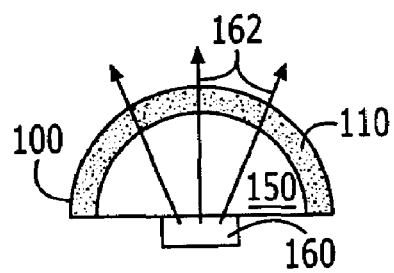

FIG. 1F illustrates other embodiments of the present invention wherein a phosphor-containing shell 100 is combined with a semiconductor light emitting device 160 that is configured to emit light 162 into and through the transparent inner core 150 and through the dome-shaped shell 100, to emerge from the dome-shaped shell 100. The semiconductor light emitting device can comprise a light emitting diode, laser diode and/or other device which may include one or more semiconductor layers, which may comprise silicon, silicon carbide, gallium nitride and/or other semiconductor materials, a substrate which may comprise sapphire, silicon, silicon carbide or other microelectronic substrates, and one or more contact layers which may comprise metal and/or other conductive layers. The design and fabrication of semiconductor light emitting devices are well known to those having skill in the art.

For example, the light emitting elements 160 may be gallium nitride based LEDs or lasers fabricated on a silicon carbide substrate such as those devices manufactured and sold by Cree, Inc. of Durham, N.C. For example, the present invention may be suitable for use with LEDs and/or lasers as described in U.S. Pat. Nos. 6,201,262, 6,187,606, 6,120,600, 5,912,477, 5,739,554, 5,631,190, 5,604,135, 5,523,589, 5,416,342, 5,393,993, 5,338,944, 5,210,051, 5,027,168, 5,027,168, 4,966,862 and/or 4,918,497, the disclosures of which are incorporated herein by reference as if set forth fully herein. Other suitable LEDs and/or lasers are described in published U.S. Patent Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Publication No. US 2002/0123164 A1 entitled Light Emitting Diodes Including Modifications for Light Extraction and Manufacturing Methods Therefor. Furthermore, phosphor coated LEDs, such as those described in U.S. Provisional Application Ser. No. 60/411,980, entitled Phosphor-Coated Light Emitting Diodes Including Tapered Sidewalls, and Fabrication Methods Therefor, filed Sep. 19, 2002, the disclosure of which is incorporated by reference herein as if set forth fully, may also be suitable for use in embodiments of the present invention.

The LEDs and/or lasers may be configured to operate such that light emission occurs through the substrate. In such embodiments, the substrate may be patterned so as to enhance light output of the devices as is described, for example, in the above-cited U.S. Patent Publication No. US 2002/0123164 A1.

Figure 1G:
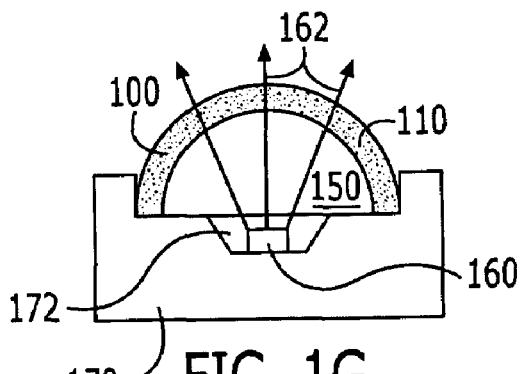

FIG. 1G is a cross-sectional view of other embodiments of the present invention. As shown in FIG. 1G, a mounting substrate 170 is provided, such that the light emitting device 160 is between the mounting substrate 170 and the transparent inner core 150. As also shown in FIG. 1G, in some embodiments, the mounting substrate 170 includes a cavity 172 therein and the light emitting device 160 is at least partially in the cavity 172.

Figure 1H:
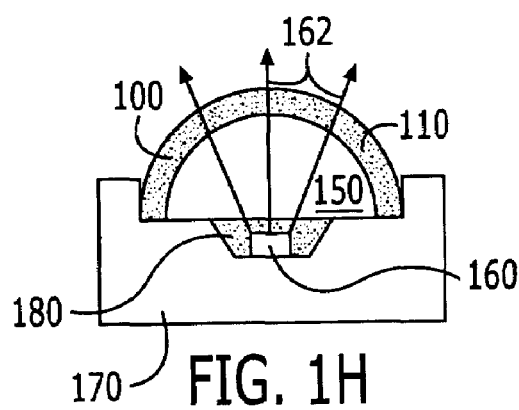

Finally, FIG. 1H illustrates yet other embodiments of the present invention. In these embodiments, the cavity 170 may be filled with an encapsulant 180, such as epoxy and/or other optical coupling media (e.g., silicon). The encapsulant 180 can enhance optical coupling from the light emitting device 160 to the transparent inner core 150. The design and fabrication of mounting substrates 170 that may be used in some embodiments of the present invention, are described in concurrently filed U.S. patent application Ser. No. 10/659,108 to Negley, entitled Solid Metal Block Mounting Substrates for Semiconductor Light Emitting Devices, and Oxidizing Methods for Fabricating Same, assigned to the assignee of the present application, the disclosure of which is hereby incorporated herein by reference in its entirety as if set forth fully herein.

It will be understood by those having skill in the art that, although the embodiments of FIGS. 1A–1H have been illustrated as separate embodiments, various elements of FIGS. 1A–1H may be used together in various combinations and subcombinations of elements. Thus, for example, combinations of inner and outer coatings 140 and 130, uniformly distributed phosphor 110 and nonuniformly distributed phosphor 120, light emitting devices 160, mounting substrates 170, cavities 172, inner cores 150 and encapsulant 180 may be used together. Accordingly, the present invention should not be limited to the separate embodiments that are shown in FIGS. 1A–1H.

Figure 2A:
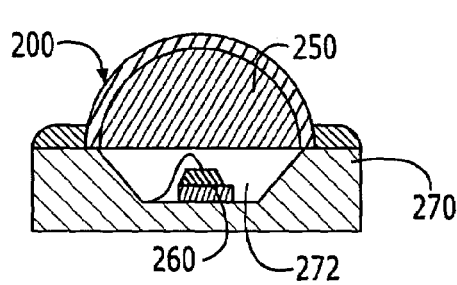
FIGS. 2A and 2B are cross-sectional views of semiconductor light emitting devices according to other embodiments of the present invention.

FIG. 2A is a cross-sectional view of light emitting devices according to other embodiments of the present invention. As shown in FIG. 2A, these embodiments include an outer shell 200 which may be made of optically clear material that is loaded with phosphor and/or other chemicals. An inner core 250 may be made of optically clear material such as plastic or glass and may be placed on an encapsulating-containing cavity 272 in a mounting substrate 270. The outer shell 200 and the inner core 250 form a composite lens for a light emitting diode 260.

Figure 2B:
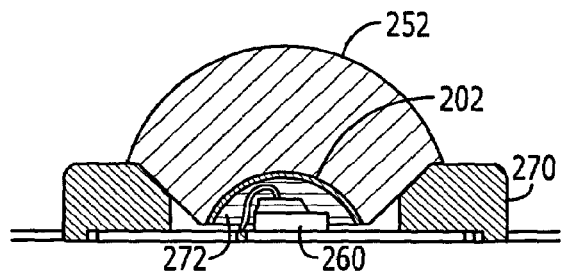

FIG. 2B is a cross-sectional view of light emitting devices according to still other embodiments of the present invention. As shown in FIG. 2B, these embodiments include an inner shell 202, which may be made of optically clear material such as a polymer loaded with phosphor and/or other chemicals. An outer shell 252 may be made of optically clear material such as plastic or glass. An encapsulating cavity 272 and a mounting substrate 270 are provided, as was the case in FIG. 2A, to form a composite lens for light emitting diode 260.

Figure 3A:
FIGS. 3A–3F are cross-sectional views of optical elements according to still other embodiments of the invention that may provide keypad keys.
Figure 3B:
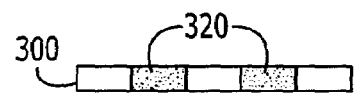

FIGS. 3A–3F are cross-sectional views of transmissive optical elements according to still other embodiments of the present invention that may be used to form keypad keys which may be used, for example, in cell phones, automobile dashboards, portable computers and other conventional devices that include an illuminated keypad. Referring now to FIG. 3A, a transmissive optical element includes a keypad key shell including a keypad key face 300 with phosphor 310 dispersed therein. In FIG. 3A, the phosphor 310 is uniformly dispersed therein, whereas in FIG. 3B, the phosphor 320 is nonuniformly dispersed therein. Nonuniform dispersion may provide different light intensity, different colors and/or indicia as was described above.

Figure 3C:
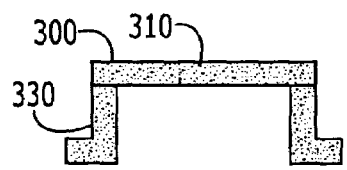
Figure 3D:
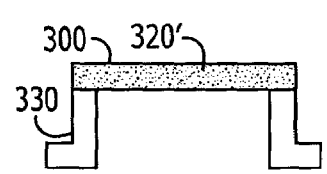
Figure 3E:
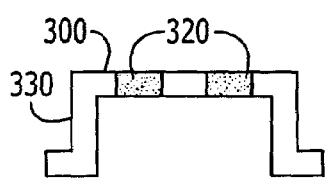

In FIG. 3C, the keypad key also includes a keypad key wall 330 that extends from the keypad key face 300. In FIG. 3C, the phosphor 310 is uniformly distributed in the keypad key face 300 and in the keypad key wall 330. In FIG. 3D, the phosphor 320' is uniformly distributed on the keypad key face 300, but is not included in the keypad key wall 330. In FIG. 3E, the phosphor 320 is nonuniformly distributed in the keypad key face 300 and is not included in the keypad key wall 330.

Figure 3F:
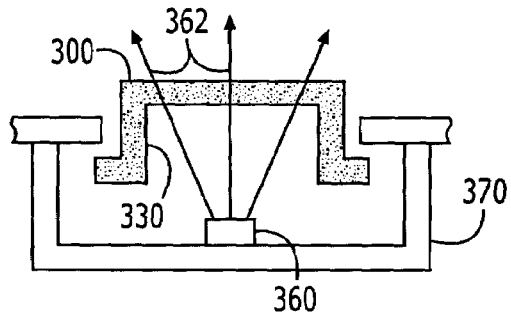

FIG. 3F illustrates a keypad key including a keypad key face 300 and a keypad key wall 330 mounted in a housing 370 and including a light emitting device 360, such as a semiconductor light emitting device, between the housing and the key, to emit light 362 through the keypad key face 300 and/or wall 330. It will be understood that light guides may be used to position the semiconductor light emitting device 360 remote from the key. It also will be understood that various elements shown in FIGS. 3A–3F may be used in combination and/or subcombination, so that, for example, uniformly and/or nonuniformly distributed phosphor 310, 320, 320' may be used in a key face and/or key wall 330. Accordingly, the invention should not be limited to the various combinations of elements that are individually shown in FIGS. 3A–3F.

FIG. 4 is a schematic block diagram of an apparatus for forming transmissive optical elements according to various embodiments of the present invention. In particular, FIG. 4 illustrates an injection molding apparatus that may be used to form transmissive optical elements according to various embodiments of the present invention. As shown in FIG. 4, an injection molding apparatus includes a hopper 410 or other storage device in which a transparent plastic and/or phosphor additive 450 are provided. The transparent plastic and/or phosphor additive may be provided in pellet, powder and/or solid form. Other additives, such as solvents, binders, etc. may be included, as is well known to those having skill in the art. An injector 420 may include a heater and a screw mechanism that is used to melt the transparent plastic and phosphor additive and/or maintain these materials in a melted state, to provide a molten liquid that comprises transparent plastic and the phosphor additive. The injector 420 injects the molten liquid into a mold 440 via nozzle 430. The mold 440 includes an appropriate channel 450 therein, which can be used to define the shape of the optical element, such as a dome or keypad key. Injection molding of optical elements is well known to those having skill in the art and is described, for example, in U.S. Pat. Nos. 4,826,424; 5,110,278; 5,882,553; 5,968,422; 6,156,242 and 6,383,417, and need not be described in further detail herein. It also will be understood that casting techniques also may be used, wherein molten liquid that comprises a transparent plastic and a phosphor additive is provided in a female mold which is then coupled to a male mold (or vice versa) to cast the optical element. Casting of optical elements is described, for example, in U.S. Pat. Nos. 4,107,238; 4,042,552; 4,141,941; 4,562,018; 5,143,660; 5,374,668; 5,753,730 and 6,391,231, and need not be described in further detail herein.

FIG. 5 is a flowchart of steps that may be used to manufacture transmissive optical elements according to various embodiments of the present invention. As shown in FIG. 5, at Block 510, a mold, such as mold 440 of FIG. 4, is filled with molten liquid that comprises a transparent plastic and a phosphor additive. At Block 520, the molten liquid is allowed to solidify to produce the optical element having phosphor dispersed therein.

FIG. 6 is a flowchart of steps that may be performed to manufacture semiconductor light emitting devices according to embodiments of the present invention. As shown in FIG. 6 at Block 610, a shell such as a dome-shaped shell 100 of FIG. 1A, that comprises a transparent plastic including a phosphor dispersed therein, is molded using injection molding, casting and/or other conventional techniques. At Block 620, a core such as a core 150 of FIG. 1E is formed. It will be understood that, in some embodiments, the core 150 is placed or formed inside the dome-shaped shell 100, whereas, in other embodiments, Block 620 precedes Block 610 by forming a transparent core 150 and filling a mold that includes a transparent core 150 with a molten liquid that comprises a transparent plastic and a phosphor additive, to form the dome-shaped shell 100 around the transparent core.

Still referring to FIG. 6, a semiconductor light emitting device, such as device 160 of FIG. 1G, is placed on a mounting substrate such as mounting substrate 170. At Block 640, an encapsulant, such as encapsulant 180 of FIG. 1H, is applied to the mounting substrate 170, the light emitting device 160 and/or the core 150. Finally, at Block 650, the shell is mated to the mounting substrate using an epoxy, a snap-fit and/or other conventional mounting techniques.

It may be desirable for the inner core 150 to fill the entire lens, so as to reduce or minimize the amount of encapsulant 180 that may be used. As is well known to those having skill in the art, the encapsulant 180 may have a different thermal expansion coefficient than the mounting substrate 170 and/or the inner core 110. By reducing or minimizing the amount of encapsulant 180 that is used at Block 640, the effect of these thermal mismatches can be reduced or minimized.

It should also be noted that in some alternate implementations, the functions/acts noted in the blocks of FIGS. 5 and/or 6 may occur out of the order noted in the flowcharts. For example, two blocks shown in succession may in fact be executed substantially concurrently or the blocks may sometimes be executed in the reverse order, depending upon the functionality/acts involved.

Accordingly, some embodiments of the present invention can form a composite optical element such as a lens using molding or casting techniques. For example, keypads for a telephone may use a two-step injection molding process to form a two-color key, or to use a lower cost plastic to give mechanical stability while using only a thinner layer of more expensive material to enhance the appearance and reduce the cost. In some embodiments, injection molding can be used to place a phosphor layer dispersed in the molding material on the inner or outer surface and then completing the molding or casting process in the remaining volume, to form a desired optical element. These optical elements can, in some embodiments, convert a blue light emitting diode behind the key or dome, to white light.

Other embodiments of the present invention may use the phosphor to evenly disperse the light and/or to disperse the light in a desired pattern. For example, conventional light emitting devices may emit light in a "Batwing" radiation pattern, in which greater optical intensity is provided at off-axis angles, such as angles of about 40° off-axis, compared to on-axis (0°) or at the sides (for example, angles greater than about 40°). Other light emitting diodes may provide a "Lambertian" radiation pattern, in which the greatest intensity is concentrated in a central area to about 40° off-axis and then rapidly drops off at larger angles. Still other conventional devices may provide a side emitting radiation pattern, wherein the greatest light intensity is provided at large angles, such as 90° from the axis, and falls rapidly at smaller angles approaching the axis. In contrast, some embodiments of the present invention can reduce or eliminate angular-dependent radiation patterns of light output from a light emitting device, such as angular dependence of Color Correlated Temperature (CCT). Thus, light intensity and the x, y chromaticity values/coordinates from all surfaces of the lens can remain relatively constant in some embodiments. This may be advantageous when used for illumination applications, such as a room where a spotlight effect is not desirable.

Injection molding processes as described above, according to some embodiments of the invention, can allow formation of a single optical element with multiple features, such as lensing and white conversion. Additionally, by using a two-molding or casting technique, according to some embodiments, one can shape the phosphor layer to its desired configuration, to reduce or minimize the angular dependence of color temperature with viewing angle.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method for forming a transmissive optical element comprising:
    filling a dome-shaped mold with a molten liquid that comprises a transparent plastic and a phosphor additive;
    allowing the molten liquid to solidify to produce a solid dome-shaped transmissive optical element having phosphor dispersed therein and including a dome-shaped inner surface and a dome-shaped outer surface; and
    forming a solid transparent dome-shaped shell including a dome-shaped inner surface and a dome-shaped outer surface directly on the dome-shaped inner surface and/or directly on the dome-shaped outer surface of the solid dome-shaped transmissive optical element having phosphor disposed therein.

2. A method according to claim 1 wherein the filling is preceded by forming the solid transparent dome-shaped shell and wherein the filling comprises filling a dome-shaped mold that includes the solid transparent dome-shaped shell with a molten liquid that comprises a transparent plastic and a phosphor additive.

3. A transmissive optical element comprising:
    a first solid dome-shaped shell that comprises a transparent plastic including a phosphor dispersed therein, the first solid dome-shaped shell including a dome-shaped inner surface and a dome-shaped outer surface; and
    a second solid dome-shaped shell including a dome-shaped inner surface and a dome-shaped outer surface directly on the dome-shaped inner and/or outer surface of the first solid dome-shaped shell.

4. A transmissive optical element according to claim 3 wherein the phosphor is uniformly dispersed in the first solid dome-shaped shell.

5. A transmissive optical element according to claim 3 wherein the phosphor is nonuniformly dispersed in the first solid dome-shaped shell to provide an indicia in the first solid dome-shaped shell.

6. A transmissive optical element according to claim 3 in combination with a semiconductor light emitting device that is configured to emit light into and through the first and second solid dome-shaped shells, to emerge from the first and second solid dome-shaped shells.

7. A transmissive optical clement according to claim 6 in further combination with a mounting substrate that is adjacent the semiconductor light emitting device such that the semiconductor light emitting device is between the mounting substrate and the first and second solid dome-shaped shells.

8. A transmissive optical element according to claim 7 in further combination with an encapsulant between the semiconductor light emitting device and the first and second solid dome-shaped shells.

9. A transmissive optical element according to claim 3 wherein the second solid dome-shaped shell is directly on the inner surface of the first solid dome-shaped shell, the transmissive optical element further comprising a third solid dome-shaped shell directly on the outer surface of the first solid dome-shaped shell.

* * * * *